(12) United States Patent
Maeda (10) Patent No.: US 11,562,944 B2
(45) Date of Patent: Jan. 24, 2023

(54) POWER CONVERSION DEVICE AND MANUFACTURING METHOD THEREOF

(71) Applicant: TOYOTA JIDOSHA KABUSHIKI KAISHA, Toyota (JP)

(72) Inventor: Tomoyuki Maeda, Toyota (JP)

(73) Assignee: DENSO CORPORATION, Kariya (JP)

( * ) Notice: Subject to any disclaimer, the term of this patent is extended or adjusted under 35 U.S.C. 154(b) by 287 days.

(21) Appl. No.: 16/830,975

(22) Filed: Mar. 26, 2020

(65) Prior Publication Data
US 2020/0388559 A1 Dec. 10, 2020

(30) Foreign Application Priority Data

Jun. 7, 2019 (JP) .............................. JP2019-107238

(51) Int. Cl.
| | |
|---|---|
| *H01L 23/473* | (2006.01) |
| *H05K 7/20* | (2006.01) |
| *H01L 25/10* | (2006.01) |
| *H01L 23/40* | (2006.01) |
| *H01L 21/67* | (2006.01) |
| *H01L 23/367* | (2006.01) |
| *H01L 21/02* | (2006.01) |

(52) U.S. Cl.
CPC ............ *H01L 23/473* (2013.01); *H01L 21/02* (2013.01); *H01L 21/67092* (2013.01); *H01L 23/367* (2013.01); *H01L 23/40* (2013.01); *H01L 23/4012* (2013.01); *H01L 25/105* (2013.01); *H05K 7/20927* (2013.01)

(58) Field of Classification Search
CPC .................. H01L 23/473; H01L 25/105; H01L 2225/1094; H01L 23/4012; H01L 23/367; H01L 21/02; H01L 21/67092; H01L 23/40; H05K 7/20927; H02M 1/00
See application file for complete search history.

(56) References Cited

U.S. PATENT DOCUMENTS

| | | | |
|---|---|---|---|
| 2011/0194248 A1* | 8/2011 | Nakasaka | ............ H01L 23/473 361/689 |
| 2012/0014066 A1* | 1/2012 | Morino | ............ H05K 7/20509 165/185 |
| 2016/0192539 A1* | 6/2016 | Sugita | ................ H05K 7/20927 361/699 |

(Continued)

FOREIGN PATENT DOCUMENTS

| | | |
|---|---|---|
| JP | 2012-257416 A | 12/2012 |
| JP | 2015-186344 A | 10/2015 |

(Continued)

*Primary Examiner* — Ahmed N Sefer
(74) *Attorney, Agent, or Firm* — Oliff PLC (57) ABSTRACT

A power conversion device includes a plurality of semiconductor modules, a plurality of coolers, and a frame. The frame pressurizes and holds a stacked body in which the semiconductor modules and the coolers are alternately stacked. The frame includes a first frame and a second frame that sandwich the stacked body therebetween. The first frame is a plate material bent to surround the stacked body from three directions, and includes a pair of side walls extending in the stacking direction of the stacked body, and an abutting wall extending between the side walls and abutting the stacked body. The abutting wall is bent outward from the frame. Each of the side walls is bent inward from the frame.

6 Claims, 10 Drawing Sheets

(56) References Cited

U.S. PATENT DOCUMENTS

| | | | | |
|---|---|---|---|---|
| 2016/0259691 A1* | 9/2016 | Boucher | ............... | G06F 9/5072 |
| 2017/0313159 A1* | 11/2017 | Takagi | ................. | H02M 7/003 |
| 2017/0325360 A1 | 11/2017 | Tanie et al. | | |
| 2018/0083548 A1* | 3/2018 | Hagimoto | .......... | H05K 7/20927 |
| 2019/0230813 A1* | 7/2019 | Kosuga | ................ | H02M 5/257 |
| 2021/0118764 A1* | 4/2021 | Lin | ....................... | H01L 23/367 |

FOREIGN PATENT DOCUMENTS

| | | |
|---|---|---|
| JP | 2016-123147 A | 7/2016 |
| JP | 2016-127774 A | 7/2016 |
| WO | 2015/198411 A1 | 12/2015 |

\* cited by examiner

POWER CONVERSION DEVICE AND MANUFACTURING METHOD THEREOF

CROSS-REFERENCE TO RELATED APPLICATION

This application claims priority to Japanese Patent Application No. 2019-107238 filed on Jun. 7, 2019, incorporated herein by reference in its entirety.

BACKGROUND

1. Technical Field

The technology disclosed in the present disclosure relates to a power conversion device and a manufacturing method thereof.

2. Description of Related Art

Japanese Unexamined Patent Application Publication No. 2012-257416 (JP 2012-257416 A) and Japanese Unexamined Patent Application Publication No. 2016-123147 (JP 2016-123147 A) describe a power conversion device in which a plurality of semiconductor modules and a plurality of coolers are alternately stacked. In these types of power conversion devices, it is necessary to pressurize and hold a stacked body of the semiconductor modules and the coolers in a stacking direction in order to increase adhesion between the semiconductor modules and the coolers. Thus, for example, in the power conversion device disclosed in JP 2012-257416 A, a pressed spring member is provided between the stacked body and a case that houses the stacked body. Alternatively, the power conversion device disclosed in JP 2016-123147 A employs a structure in which the stacked body is sandwiched between a housing body having an opening and a housing cover that closes the opening into the housing body, and the housing body and the housing cover are connected by bolts while a predetermined pressurizing force is applied to the stacked body.

SUMMARY

In the structure disclosed in JP 2012-257416 A, since it is necessary to house both the stacked body and the spring member in the case, a relatively large case is needed for the stacked body. Further, the stiffness required of the case is relatively high so as to resist a reaction force of the spring member. Therefore, it also leads to an increase in the size of the case, that is, an increase in the size of the power conversion device. On the other hand, with the structure disclosed in JP 2016-123147 A, since the spring member can be omitted, the size of the power conversion device can be reduced. However, since there is no spring member, an amount of a pressurizing force applied to the stacked body may be insufficient when, for example, creep deformation occurs in the semiconductor module or the cooler. The present specification provides a technology capable of sufficiently securing the amount of pressurizing force applied to the stacked body while realizing a reduction in the size of the power conversion device.

A power conversion device according to a first aspect of the present disclosure disclosed in the present specification includes a plurality of semiconductor modules, a plurality of coolers, and a frame. Each of the semiconductor modules has a semiconductor element. Each of the coolers has a refrigerant flow path therein. The frame pressurizes and holds a stacked body in which the semiconductor modules and the coolers are alternately stacked in a stacking direction of the stacked body. The frame includes a first frame and a second frame that sandwich the stacked body therebetween. The first frame is a plate material bent to surround the stacked body from three directions, and includes a pair of side walls extending in the stacking direction of the stacked body and an abutting wall extending between the side walls and abutting the stacked body. The abutting wall is bent outward from the frame. Each of the side walls is bent inward from the frame.

In the above configuration, the stacked body of the semiconductor modules and the coolers is sandwiched between the first frame and the second frame. The first frame is made of a plate material bent to surround the stacked body from the three directions, and each of the wall surfaces of the first frame is bent like a plate spring. As such, the first frame itself can serve as the spring member. Therefore, a spring member or a case having high stiffness is not required, and a sufficient amount of pressurizing force to the stacked body can be secured. In other words, the amount of pressurizing force on the stacked body can be sufficiently secured while realizing a reduction of the size of the power conversion device.

In the first aspect, a bending stiffness in the stacking direction of the second frame may be higher than a bending stiffness in the stacking direction of the abutting wall of the first frame. With such a configuration, since deformation of the second frame is restrained, the power conversion device can be assembled with high accuracy by, for example, using the second frame as a reference.

In addition to, or instead of, the above configuration, a bending stiffness in the stacking direction of the second frame may be higher than a bending stiffness in a plate thickness direction of the side walls of the first frame. Since deformation of the second frame is prevented with such a configuration as well, the power conversion device can be assembled with high accuracy by, for example, using the second frame as the reference.

In the first aspect, the second frame may be a plate material having at least one bent portion, and a bent line, that is, a ridge line, of the bent portion may be bent between the side walls in a direction perpendicular to the stacking direction. With such a configuration, the second frame having high bending stiffness can be easily manufactured.

In the first aspect, the first frame may be made of metal. With such a configuration, a first frame having desired characteristics (for example, appropriate elasticity or strength) can be easily manufactured.

A second aspect of the present disclosure disclosed in the present specification is a manufacturing method of the power conversion device. The power conversion device includes a plurality of semiconductor modules, a plurality of coolers, and a frame. Each of the semiconductor modules has a semiconductor element. Each of the coolers has a refrigerant flow path therein. The frame pressurizes and holds a stacked body in which the semiconductor modules and the coolers are alternately stacked in a stacking direction of the stacked body. The frame includes a first frame and a second frame. The first frame is a plate material bent to surround the stacked body from three directions, and includes a pair of side walls extending along the stacking direction of the stacked body and an abutting wall extending between the side walls and abutting the stacked body. The manufacturing method includes a step of arranging the stacked body between the first frame and the second frame, a step of pressurizing the second frame toward the stacked body while both ends of the first frame are in a fixed state, and a step of fixing the second frame to the first frame while a first pressurizing force is applied to the stacked body during the step of pressurizing. In this case, when the first pressurizing force is applied to the stacked body, the abutting wall is bent outward from the frame, and each of the side walls is bent inward from the frame. With such a configuration, since it is possible to fix the second frame to the first frame while monitoring the pressurizing state of the stacked body, the pressurizing force applied to the stacked body can be accurately adjusted.

In the second aspect, a grease-state thermal interface material (TIM) may be applied between a semiconductor module and a cooler adjacent to the semiconductor module, in the stacked body. In this case, the semiconductor module is included in the plurality of semiconductor modules and the cooler is included in the plurality of coolers.

In the second aspect, the manufacturing method may further include a step of installing a load receiver on an outside of the abutting wall before the step of pressurizing. During the step of pressurizing, the pressurizing force applied to the stacked body may be increased to a second pressurizing force larger than the first pressurizing force, and then decreased to the first pressurizing force. With such a configuration, the grease-state TIM applied between the semiconductor module and the cooler adjacent to the semiconductor module can be spread in a relatively short time.

In the second aspect, during the step of pressurizing, the pressurizing force applied to the stacked body may be increased to a third pressurizing force larger than the first pressurizing force such that plastic deformation occurs in a bent portion of the first frame, and then decreased to the first pressurizing force. With such a configuration, an elastic region (a range of the load where elastic deformation is maintained) is expanded in the bent portion (a connection portion between the abutting wall and the side wall) where stress is concentrated, due to work-hardening caused by plastic deformation. In addition, the first frame has a structure in which the abutting wall and the side walls, each functioning as a plate spring, are connected through the bent portions. As such, even when residual distortion in the bent portion is increased, the stress at the elastic limit of the bent portion is increased so that the residual distortion in the entire first frame is kept relatively small. Therefore, spring characteristics of the first frame serving as a spring member can be improved, and particularly, an allowable displacement region where the first frame can be elastically deformed may be greatly expanded.

Details and further improvements of each aspect disclosed in the present specification will be described in "DETAILED DESCRIPTION OF THE EMBODIMENTS" below.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein.

DETAILED DESCRIPTION OF EMBODIMENTS

Figure 1:
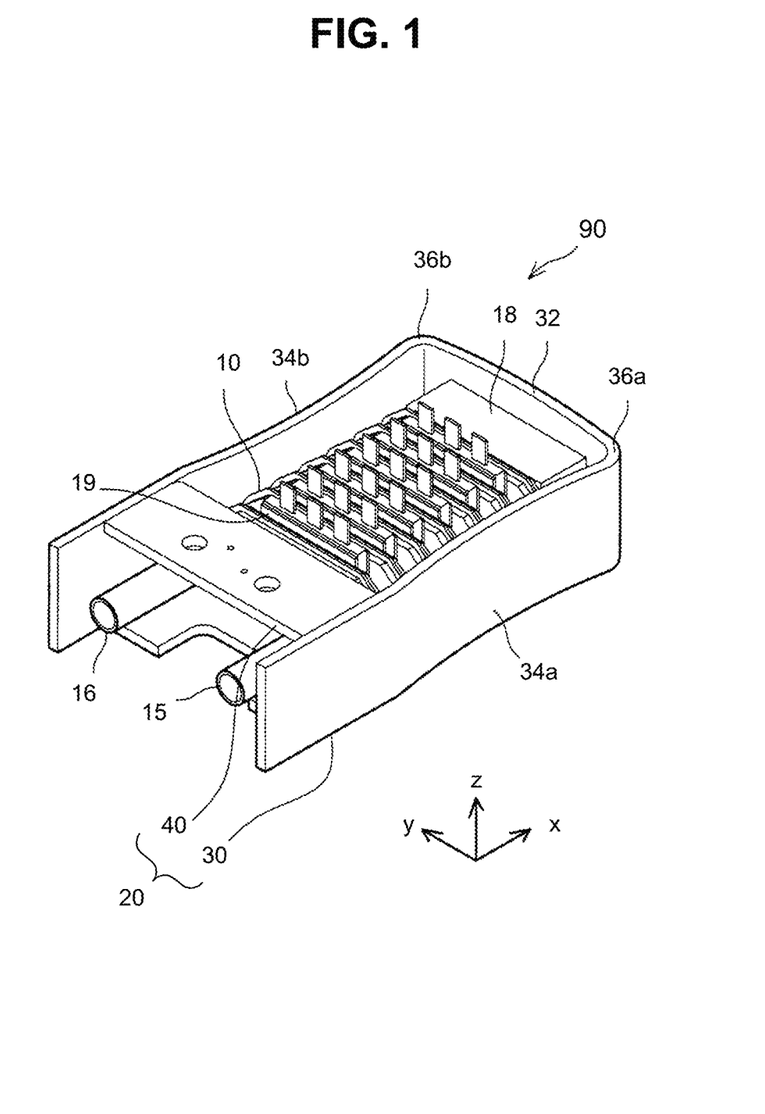
FIG. 1 is a perspective view of a power conversion device according to an embodiment.

A power conversion device 90 according to an embodiment will be described with reference to the drawings. The power conversion device 90 according to the embodiment performs power conversion between a power source and a load. The power conversion device 90 may be mounted on, for example, an electric vehicle, but is not limited thereto, and can be used as a power conversion device for various applications. As illustrated in FIG. 1, the power conversion device 90 includes a stacked body 10 and a frame 20. The stacked body 10 is pressurized and held by the frame 20.

Figure 2:
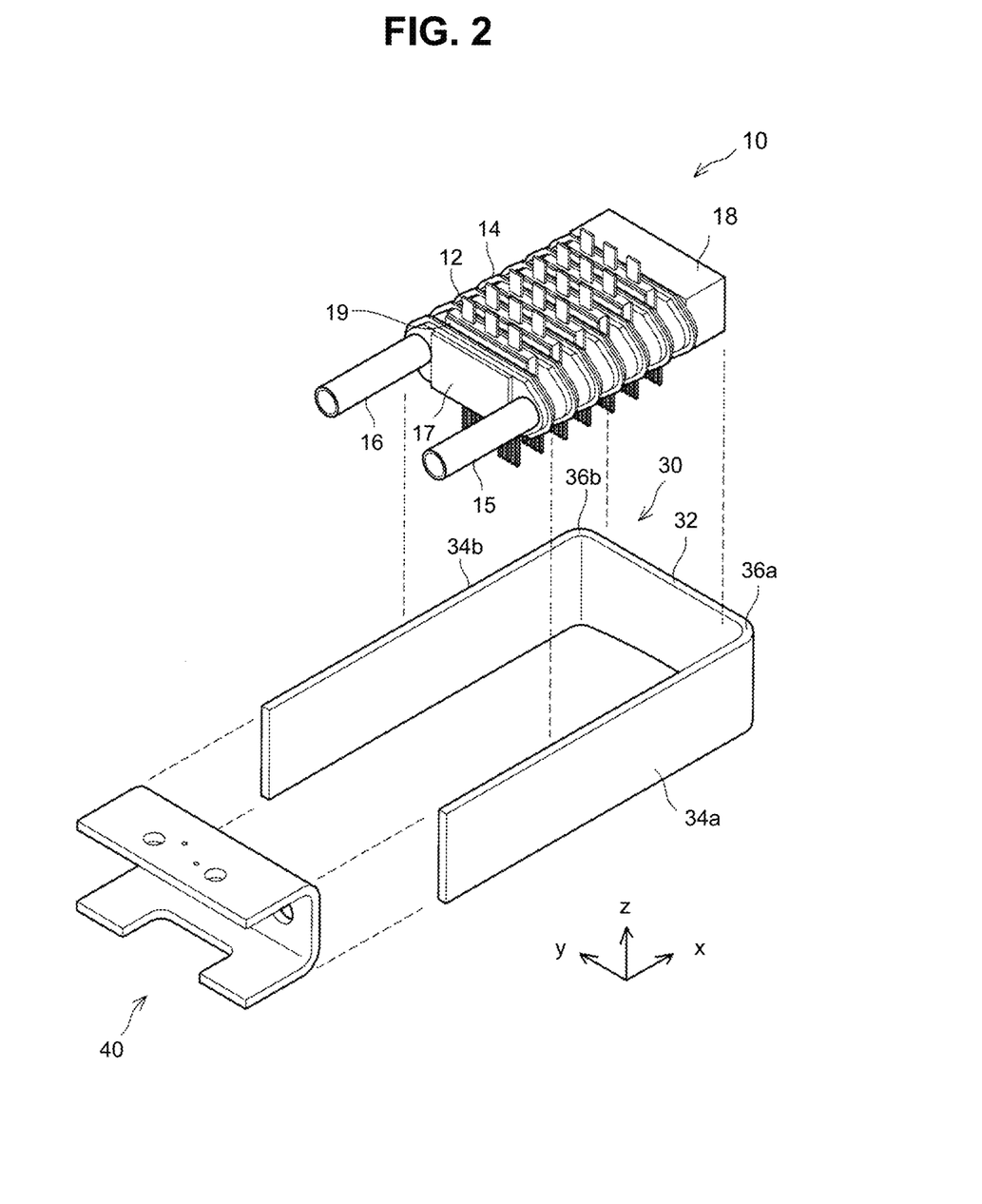
FIG. 2 is an exploded perspective view illustrating components in a stage before assembling the power conversion device according to the embodiment.
Figure 3:
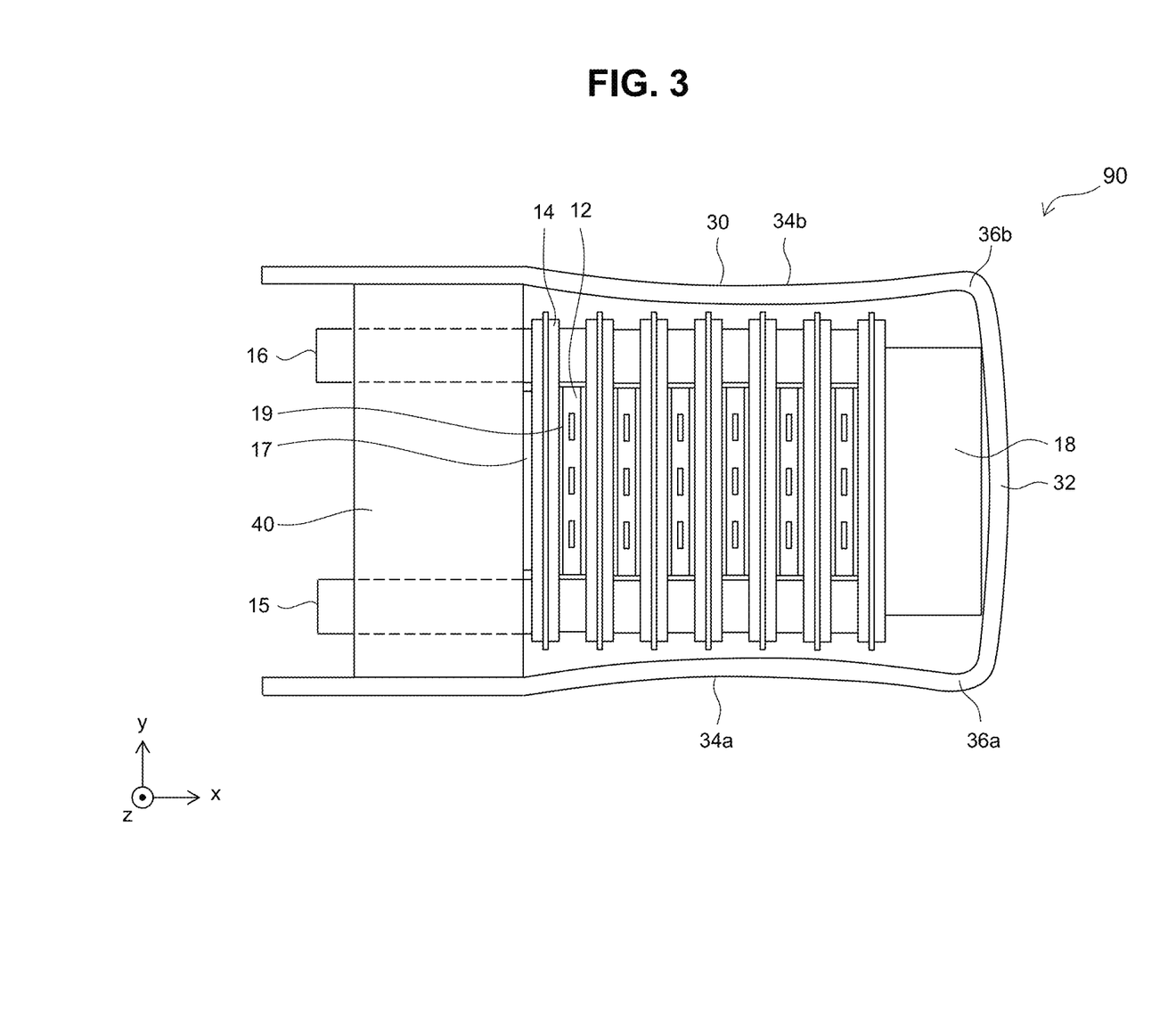
FIG. 3 is a plan view of the power conversion device according to the embodiment.

As illustrated in FIGS. 2 and 3, the stacked body 10 is a unit in which the semiconductor modules 12 and the coolers 14 are alternately stacked. The semiconductor module 12 is a device including a plurality of semiconductor elements (not shown) therein. The semiconductor element is for power conversion and is also referred to as a power semiconductor element. A large amount of heat is generated when high current flows through the power semiconductor element. Therefore, the power conversion device 90 is provided with the cooler 14 that cools the semiconductor module 12. Particularly, since two coolers 14 are adjacent to one semiconductor module 12 on both sides, the semiconductor module 12 is effectively cooled. An insulating plate 19 is arranged between the semiconductor module 12 and its adjacent cooler 14. Further, a grease-state TIM is applied between a semiconductor module 12 and its adjacent insulating plate 19 and between the insulating plate 19 and its adjacent cooler 14. The grease-state TIM is applied to improve efficiency of heat transfer. In FIG. 2, a reference numeral 12 is given to only one semiconductor module, and reference numerals are omitted from the other semiconductor modules. Moreover, a reference numeral 14 is given to only one cooler, and reference numerals are omitted from the other coolers. Furthermore, a reference numeral 19 is given to only one insulating plate, and reference numerals are omitted from the other insulating plates. The same applies to the other drawings.

The cooler 14 has a flow path through which a refrigerant flows therein. The refrigerant flows in a direction (a y direction in FIG. 2) perpendicular to a stacking direction of the stacked body 10 (an x direction in FIG. 2). The plurality of coolers 14 communicate with each other through a communication pipe. A refrigerant supply pipe 15 and a refrigerant discharge pipe 16 are connected to the cooler 14 located at one end in the stacking direction of the power conversion device 90. The refrigerant supplied through the refrigerant supply pipe 15 is distributed to all the coolers 14 through the communication pipe. The refrigerant absorbs heat from the adjacent semiconductor module 12 while passing through each cooler 14. The refrigerant that has passed through each cooler 14 passes through the communication pipe and is discharged from the refrigerant discharge pipe 16. The refrigerant flowing through the cooler 14 is a liquid, and may be, for example, water or a long life coolant (LLC).

As described above, the stacked body 10 of the plurality of semiconductor modules 12 and the plurality of coolers 14 is pressurized and held by the frame 20 in the stacking direction so as to increase adhesion between the semiconductor module 12 and the cooler 14, and improve the cooling performance of the semiconductor module 12 by the cooler 14. The frame 20 is composed of a first frame 30 and a second frame 40. The stacked body 10 is sandwiched between the first frame 30 and the second frame 40. Moreover, a front spacer 17 is inserted between the second frame 40 and the stacked body 10. In addition, a rear spacer 18 is inserted between the first frame 30 and the stacked body 10. The stacked body 10 is pressurized and held by the first frame 30 and the second frame 40 in the stacking direction (the x direction).

The first frame 30 includes an abutting wall 32 and a pair of side walls 34a, 34b. The side walls 34a, 34b extend along the stacking direction of the stacked body 10 and face each other with the stacked body 10 therebetween. The abutting wall 32 extends between the side walls 34a, 34b. The abutting wall 32 and the side wall 34a are connected to each other by a bent portion 36a. In addition, the abutting wall 32 and the side wall 34b are connected to each other by a bent portion 36b. In other words, the first frame 30 is a plate material bent to surround the stacked body 10 from three directions. The abutting wall 32 pressurizes the stacked body 10 in the stacking direction through the rear spacer 18. The first frame 30 is made of, for example, metal.

The abutting wall 32 is bent outward from the frame 20. Moreover, each of the side walls 34a, 34b is bent inward from the frame 20. As to be described in detail below, each of the abutting wall 32 and the side walls 34a, 34b is bent to the above-described shape by pressurizing the second frame 40 toward the stacked body 10 while both ends of the first frame 30 are in a fixed state. The second frame 40 is fixed to the first frame 30 while the abutting wall 32 is bent outward from the frame 20 and each of the side walls 34a, 34b is bent inward from the frame 20. The second frame 40 is fixed to the first frame 30 by, for example, welding.

Bending stiffness of the second frame 40 in the stacking direction (the x direction) is higher than the bending stiffness of the abutting wall 32 in the stacking direction (the x direction) and the bending stiffness of the side walls 34a, 34b in the plate thickness direction (y direction). As such, deformation of the second frame 40 is prevented. Therefore, the power conversion device 90 can be assembled with high accuracy by, for example, using the second frame 40 as a reference. Further, since the first frame 30 is made of metal, a first frame 30 having desired characteristics (for example, appropriate elasticity and strength) can be easily manufactured.

With the above configuration, the stacked body 10 of the semiconductor modules 12 and the coolers 14 is sandwiched between the first frame 30 and the second frame 40. The first frame 30 is made of a plate material bent to surround the stacked body 10 from the three directions, and the abutting wall 32 and the side walls 34a, 34b are bent like plate springs. As such, the first frame 30 itself can serve as a spring member which pressurizes the stacked body 10 in the stacking direction. Therefore, a spring member or a case having high stiffness is not required, and a sufficient amount of pressurizing force to the stacked body 10 can be secured. In other words, the amount of pressurizing force applied to the stacked body 10 can be sufficiently secured while realizing a reduction of the size of the power conversion device 90.

In the present embodiment, the second frame 40 may be a plate material having at least one bent portion. A bending line, that is, a ridge line, of a bent portion provided in the second frame 40 is bent between the side walls 34a, 34b in a direction perpendicular to the stacking direction. With such a configuration, the second frame 40 having high bending stiffness can be easily manufactured. Further, the second frame 40 is not necessarily limited to a plate material, and may be, for example, a block-shaped member.

Figure 4:
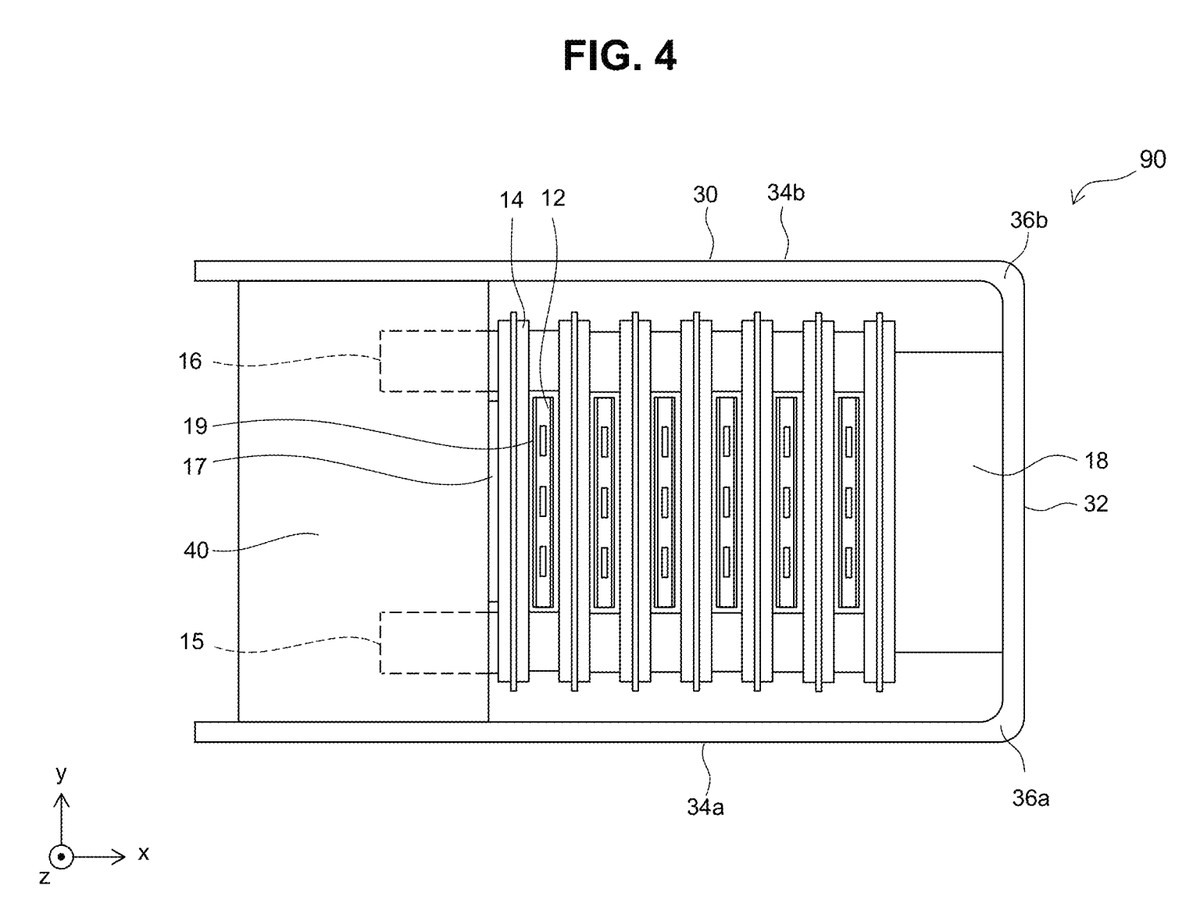
FIG. 4 is a plan view illustrating arrangement of each component of the power conversion device in a stage before assembling.

Subsequently, with reference to FIGS. 4 to 6, the manufacturing method of the power conversion device 90 according to the embodiment will be described. As illustrated in FIG. 4, first, a process of arranging the stacked body 10 between the first frame 30 and the second frame 40 is performed. As described above, the semiconductor modules 12 and the coolers 14 are alternately stacked in the stacked body 10. The insulating plate 19 is inserted between the semiconductor module 12 and its adjacent cooler 14. The grease-state TIM is applied between the semiconductor module 12 and the insulating plate 19, and between the insulating plate 19 and the cooler 14. On the other hand, since no pressurizing force is applied to the stacked body 10 at this stage, it can be said that the stacked body 10 is in a temporarily assembled state.

As described above, the first frame 30 is a plate material bent to surround the stacked body 10 from the three directions. The abutting wall 32 of the first frame 30 faces the stacked body 10 on one side in the stacking direction with the rear spacer 18 therebetween. The second frame 40 faces the stacked body 10 on the other side in the stacking direction with the front spacer 17 therebetween. As illustrated in FIG. 4, at this stage, each of the abutting wall 32 and the side walls 34a, 34b of the first frame 30 is not bent. In other words, each of the abutting wall 32 and the side walls 34a, 34b maintains a flat shape. In the bent portion 36a where the abutting wall 32 and one side wall 34a are connected to each other, an angle formed between the abutting wall 32 and the side wall 34a may be, for example, a right angle. Similarly, in the bent portion 36b where the abutting wall 32 and the other side wall 34b are connected to each other, an angle formed between the abutting wall 32 and the other side wall 34b may be, for example, a right angle.

Figure 5:
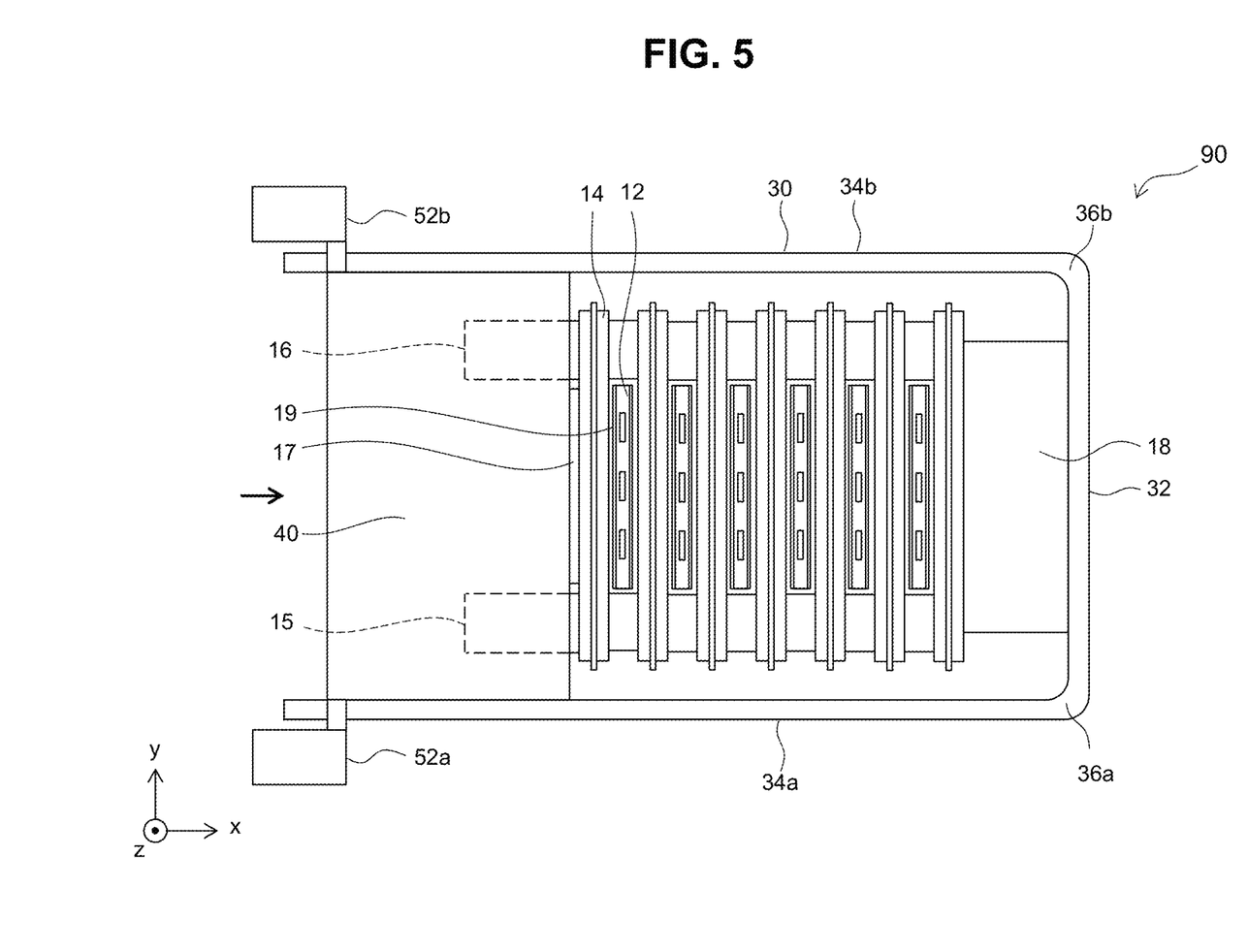
FIG. 5 is a plan view illustrating the power conversion device during a pressurizing process.

Next, as illustrated in FIG. 5, a process of pressurizing the second frame 40 toward the stacked body 10 is performed. During the pressurizing process, both ends of the first frame 30 are fixed by fixing members 52a, 52b. Specifically, an open end of one side wall 34a is fixed to one fixing member 52a, and an open end of the other side wall 34b is fixed to the other fixing member 52b. The pressurizing force is applied to the second frame 40 while both ends of the first frame 30 are in a fixed state by the fixing members 52a, 52b. The pressurizing force applied to the second frame 40 is applied in the stacking direction (the x direction in FIG. 5).

An arrow in FIG. 5 represents the pressurizing force applied to the second frame 40. As such, the stacked body 10 is pressurized in the stacking direction.

When the pressurizing force applied to the second frame 40 is increased, adhesion between the semiconductor module 12, the insulating plate 19, and the cooler 14 in the stacked body 10 is improved. At the same time, the abutting wall 32 is bent outward from the frame 20, and each of the side walls 34a, 34b is bent inward from the frame 20. For convenience of description, the pressurizing force applied to the second frame 40 when the first frame 30 is bent to a desired shape is defined as a first pressurizing force F1.

Figure 6:
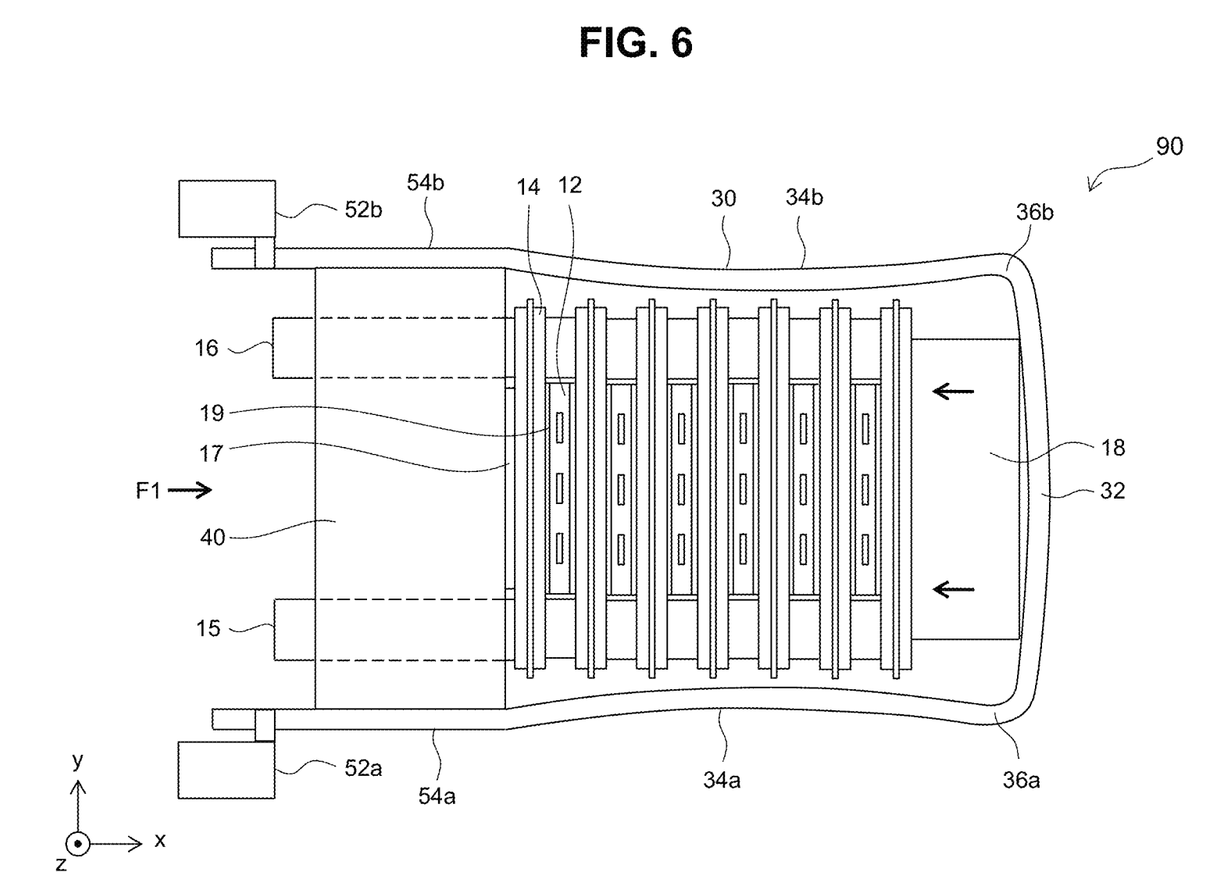
FIG. 6 is a plan view illustrating the power conversion device when a pressurizing force that bends a first frame to a desired shape is being applied to a second frame.

FIG. 6 is a plan view illustrating the power conversion device 90 when the first pressurizing force F1 is being applied to the second frame 40. An arrow in a positive direction of the x-axis in FIG. 6 represents the first pressurizing force F1 applied to the second frame 40. Arrows in a negative direction of the x-axis in FIG. 6 represent a reaction force against the first pressurizing force F1. As described above, the first frame 30 is bent to the desired shape when the first pressurizing force F1 is applied to the second frame 40. In other words, the abutting wall 32 is bent outward from the frame 20, and each of the side walls 34a, 34b is bent inward from the frame 20. In this state, a process of fixing the second frame 40 to the first frame 30 is performed. The second frame 40 can be fixed to the first frame 30 by, for example, welding.

When the second frame 40 has been fixed to the first frame 30, the first pressurizing force F1 being applied to the second frame 40 is removed. Since the second frame 40 is fixed to the first frame 30 while the first pressurizing force F1 is being applied to the second frame 40, a force equivalent to the first pressurizing force F1 continues to be applied to the stacked body 10 in the stacking direction as the pressurizing when the first pressurizing force F1 is removed.

Further, when the second frame 40 has been fixed to the first frame 30, the fixing members 52a, 52b are removed from both ends of the first frame 30. As such, the power conversion device 90 according to the embodiment is completed.

With the manufacturing method of the power conversion device 90 described above, it is possible to fix the second frame 40 to the first frame 30 while monitoring the pressurizing state of the stacked body 10. Therefore, the pressurizing force applied to the stacked body 10 can be accurately adjusted regardless of, for example, a dimensional error in size that may occur in manufacturing the stacked body 10.

Moreover, in the manufacturing method of the power conversion device 90 described above, a process of installing a load receiver 56 may be performed before performing the pressurizing process. The installation process is performed to efficiently spread the grease-state TIM applied between the semiconductor module 12 and the insulating plate 19, and between the insulating plate 19 and the cooler 14. In general, the amount of time for spreading the grease-state TIM and the pressurizing force applied to the stacked body 10, that is, the pressurizing force applied to the second frame 40, are inversely proportional. In other words, when the pressurizing force applied to the second frame 40 is increased, the amount of time for spreading the grease-state TIM is reduced. However, when the pressurizing force is excessively increased, the first frame 30 may be unintentionally deformed or damaged. In order to avoid this, the load receiver 56 is installed.

Figure 7:
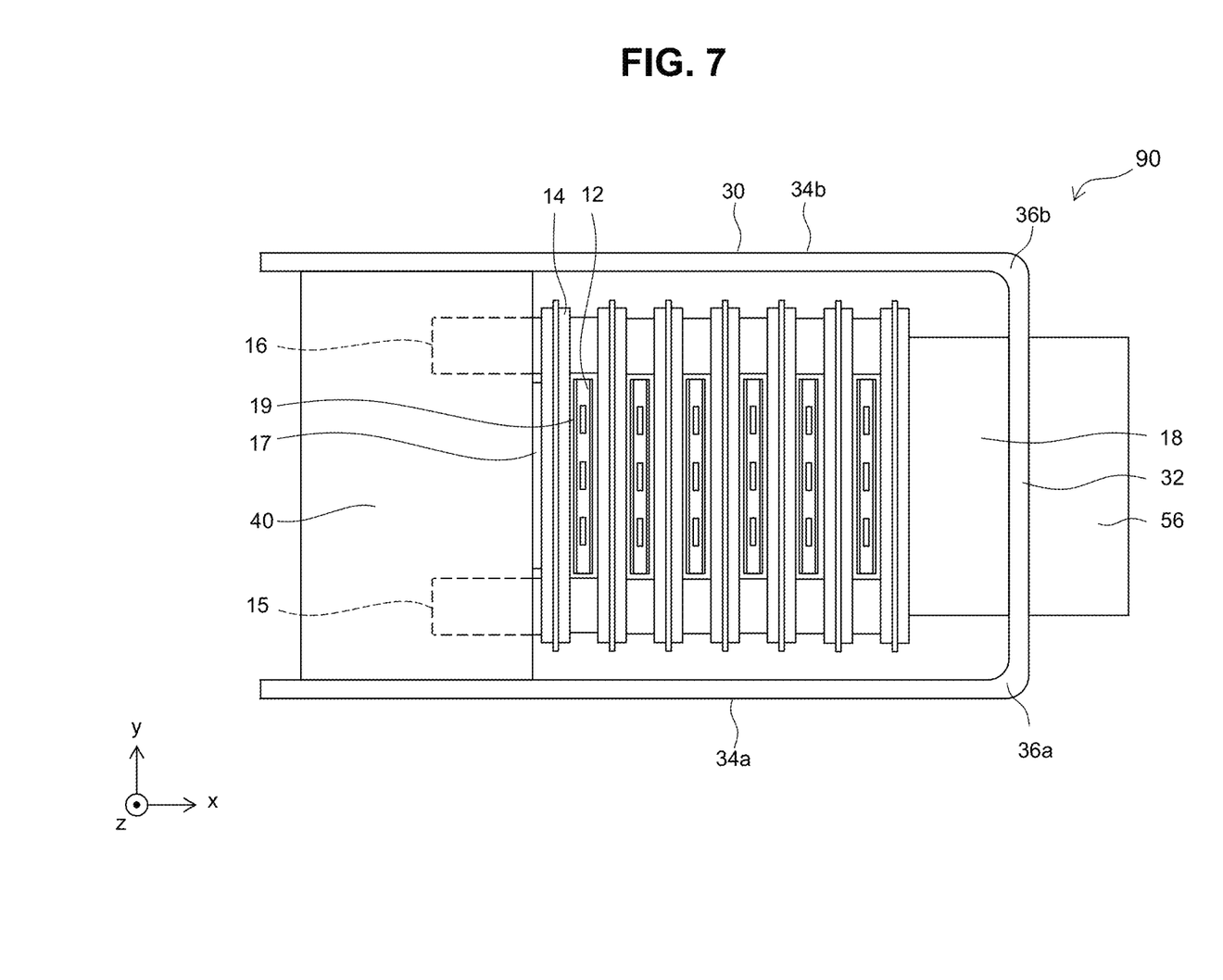
FIG. 7 is a plan view of the power conversion device during a process of installing a load receiver.

FIG. 7 is a plan view of the power conversion device 90 during the process of installing the load receiver 56. As illustrated in FIG. 7, the load receiver 56 is installed on the outside of the abutting wall 32 while the stacked body 10 is arranged between the first frame 30 and the second frame 40.

Figure 8:
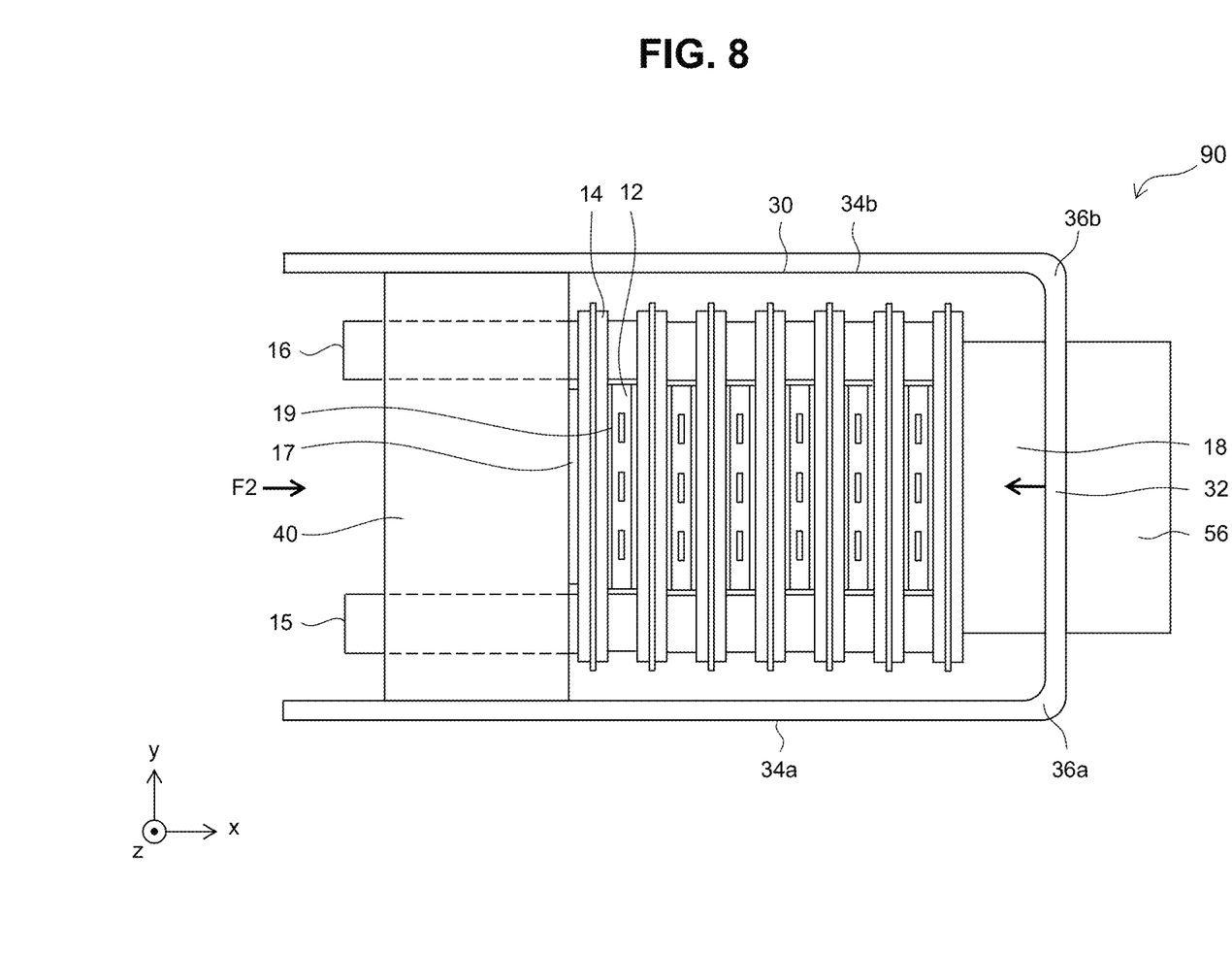
FIG. 8 is a plan view of the power conversion device during the pressurizing process after installing the load receiver.

After the load receiver 56 is installed on the outside of the abutting wall 32, the pressurizing process is performed. FIG. 8 is a plan view of the power conversion device 90 during the pressurizing process after the process of installing the load receiver 56. When the load receiver 56 is installed on the outside of the abutting wall 32, both ends of the first frame 30 do not have to be fixed to the fixing members 52a, 52b during the pressurizing process.

When the load receiver 56 is installed on the outside of the abutting wall 32, first, the pressurizing force applied to the second frame 40 is increased to a second pressurizing force F2 during the pressurizing process. The second pressurizing force F2 is larger than the first pressurizing force F1. An arrow in the positive direction of the x-axis in FIG. 8 represents the second pressurizing force F2 applied to the second frame 40. An arrow in the negative direction of the x-axis in FIG. 8 represents a reaction force against the second pressurizing force F2. Here, since the load receiver 56 is installed on the outside of the abutting wall 32, the first frame 30 is not bent. Thereafter, the second pressurizing force F2 being applied to the second frame 40 is removed. When the second pressurizing force F2 has been removed, the load receiver 56 installed on the outside of the abutting wall 32 is removed. Then, both ends of the first frame 30 are fixed by the fixing members 52a, 52b. When both ends of the first frame 30 have been fixed, the first pressurizing force F1 is applied to the second frame 40, such that the first frame 30 is bent to the desired shape.

With the manufacturing method of the power conversion device 90 described above, the second frame 40 is pressurized by the second pressurizing force F2 larger than the first pressurizing force F1 by which the first frame 30 is bent to the desired shape. Here, since the load receiver 56 is installed on the outside of the abutting wall 32, reduction of the amount of time required for spreading the grease-state TIM is realized by applying the second pressurizing force F2, which is a sufficient pressurizing force without unintentionally deforming or damaging the first frame 30.

Figure 9:
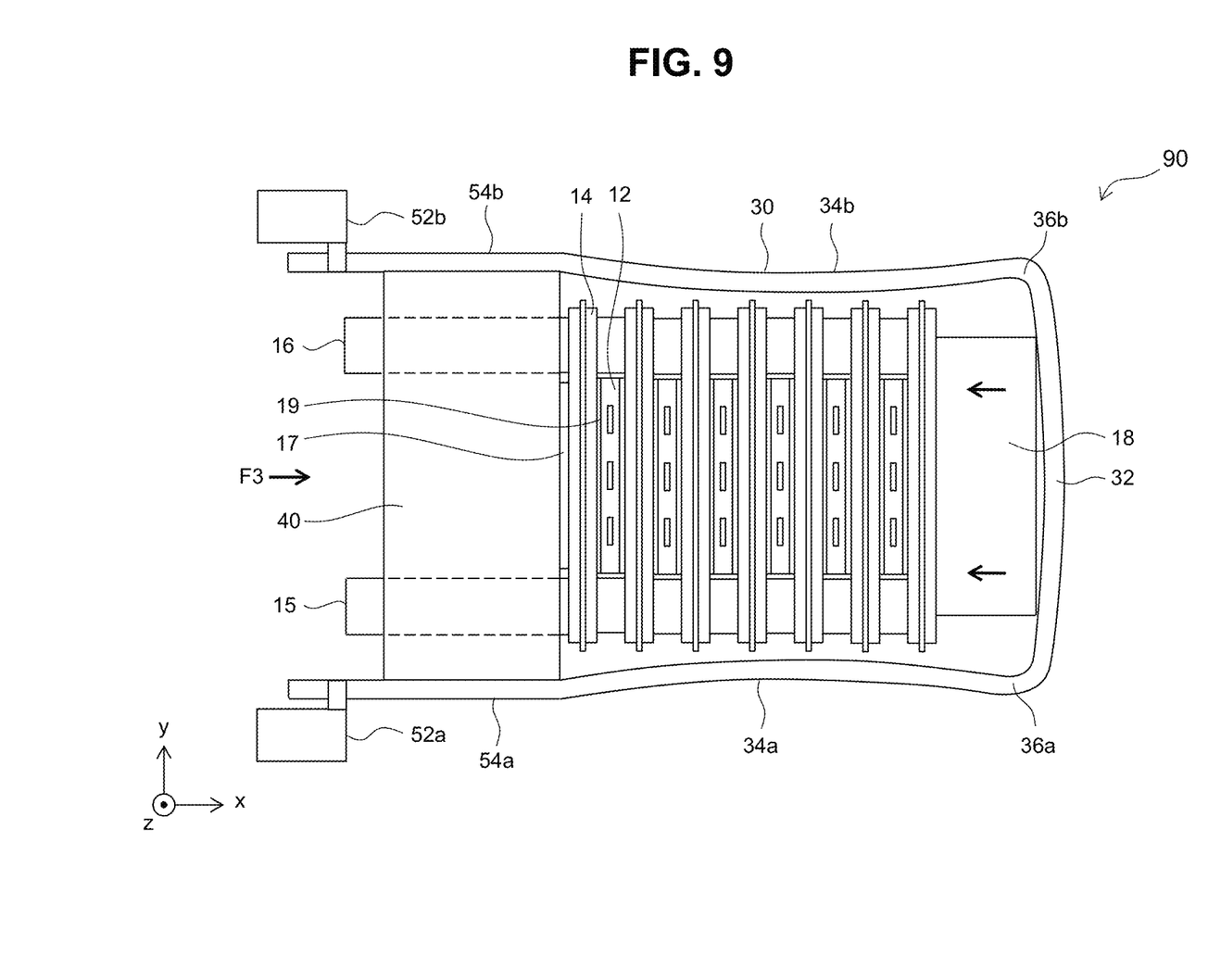
FIG. 9 is a plan view of the power conversion device when the pressurizing force that causes plastic deformation in bent portions of the first frame is being applied to the second frame.

Alternatively, the pressurizing force applied to the second frame 40 may be temporarily increased to the third pressurizing force F3 larger than the first pressurizing force F1 which is the final pressurizing force, without installing the load receiver 56. The third pressurizing force F3 has a force that may cause plastic deformation in the bent portions 36a, 36b of the first frame 30. FIG. 9 is a plan view of the power conversion device 90 when the third pressurizing force F3 is being applied to the second frame 40. An arrow in the positive direction of the x-axis in FIG. 9 represents the third pressurizing force F3 applied to the second frame 40. Arrows in the negative direction of the x-axis in FIG. 9 represent a reaction force against the third pressurizing force F3. When plastic deformation occurs in the bent portions 36a, 36b by increasing the pressurizing force applied to the second frame 40 to the third pressurizing force F3, the pressurizing force applied to the second frame 40 is decreased from the third pressurizing force F3 to the first pressurizing force F1.

The pressurizing force applied to the second frame 40 is concentrated on the bent portions 36a, 36b of the first frame 30. In other words, the stress on the bent portions 36a, 36b is larger than the stress on parts other than the bent portions 36a, 36b of the first frame 30. Therefore, plastic deformation is more likely to occur in the bent portions 36a, 36b than the parts other than the bent portions 36a, 36b of the first frame 30. As plastic deformation occurs in the bent portions 36a, 36b, elastic regions in the bent portions 36a, 36b are expanded due to work-hardening caused by the plastic deformation. At the same time, residual distortion occurs in the bent portions 36a, 36b. As described above, the first frame 30 has a structure in which the abutting wall 32 and the side walls 34a, 34b, each functioning as a plate spring, are connected through the bent portions 36a, 36b. As to be described in detail below, by such a structure, even when residual distortion in the bent portions 36a, 36b is increased, the stress at the elastic limit of the bent portions 36a, 36b is increased so that the amount of elastic deformation (bending) that may occur in the side walls 34a, 34b is increased. As a result, the residual distortion in the stacking direction in the entire first frame 30 is kept relatively small. With the manufacturing method of the power conversion device 90, spring characteristics of the first frame serving 30 as a spring member can be improved, and particularly, an allowable displacement region where the first frame 30 can be elastically deformed may be greatly expanded.

Figure 10A:
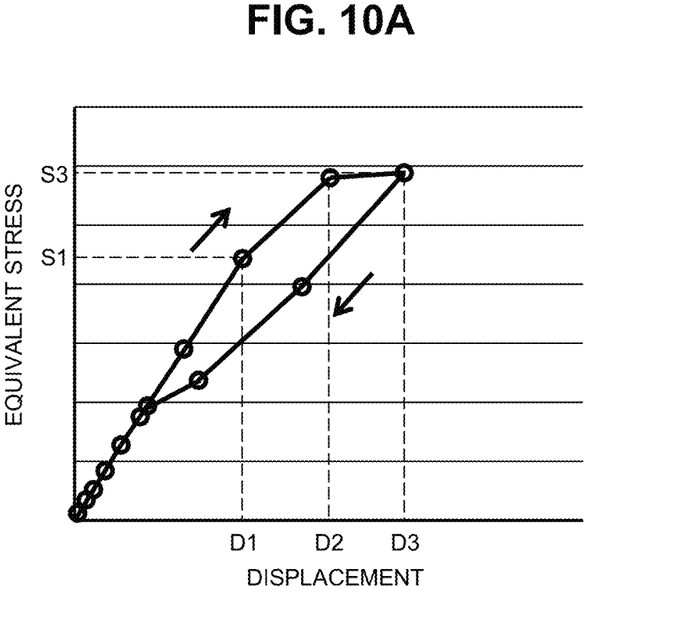
FIG. 10A is a graph illustrating a relationship between equivalent stress and displacement when plastic deformation occurs in the bent portions.
Figure 10B:
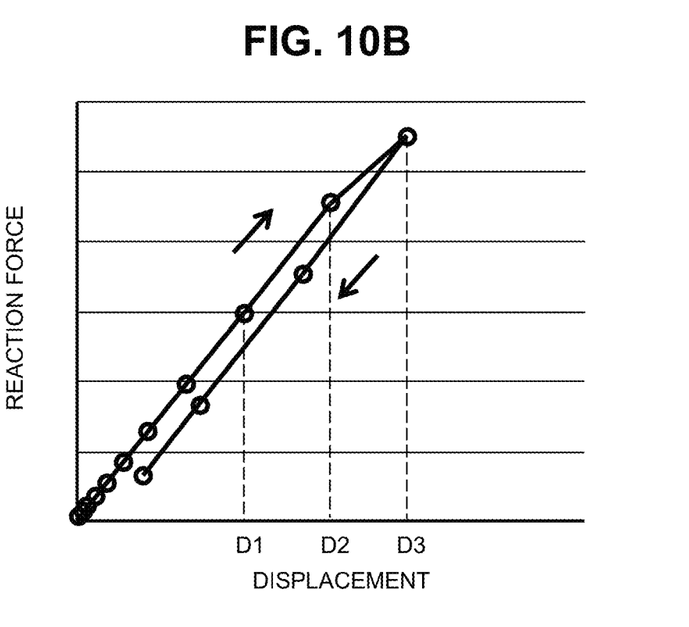
FIG. 10B is a graph illustrating a relationship between a reaction force and the displacement when the plastic deformation occurs in the bent portions.

FIGS. 10A and 10B are graphs each illustrating a relationship between equivalent stress and displacement, and a relationship between the reaction force and the displacement when plastic deformation occurs in the bent portions 36a, 36b by applying the third pressurizing force F3 to the second frame 40. Here, the equivalent stress means the stress on the bent portions 36a, 36b. Further, the displacement means the displacement in the stacking direction of the first frame 30. The reaction force means the force applied to the stacked body 10 from the abutting wall 32.

FIG. 10A is a graph illustrating the relationship between the equivalent stress and the displacement when the plate thickness of the first frame 30 is 3.2 millimeters. Moreover, FIG. 10B is a graph illustrating the relationship between the reaction force and the displacement when the plate thickness of the first frame 30 is 3.2 millimeters. The directions of the arrows in FIGS. 10A and 10B represent a time series. When the equivalent stress on the bent portions 36a, 36b is increased to S1 by increasing the pressurizing force applied to the second frame 40, the displacement becomes D1. During this period, the bent portions 36a, 36b are the elastic regions.

When the equivalent stress on the bent portions 36a, 36b is further increased from S1, the bent portions 36a, 36b are changed from the elastic regions to plastic regions. When the equivalent stress on the bent portions 36a, 36b is increased to S3, plastic deformation occurs in the bent portions 36a, 36b so that the displacement of the first frame 30 is increased to D3. Thereafter, the equivalent stress on the bent portions 36a, 36b is decreased from S3. Accordingly, the displacement of the first frame 30 becomes less than D3. Here, by the structure of the first frame 30, even when the residual distortion in the bent portions 36a, 36b is increased, the residual distortion in the stacking direction in the entire first frame 30 is kept relatively small. In other words, the spring characteristics of the first frame 30 serving as a spring member is improved, and particularly, the allowable displacement region where the first frame 30 can be elastically deformed is expanded. In the present embodiment, as illustrated in FIG. 10B, the elastic limit of the first frame 30 before plastic deformation occurs in the bent portions 36a, 36b is D2. The elastic limit of the first frame 30 after plastic deformation has occurred in the bent portions 36a, 36b is D3. As such, the allowable displacement in which the first frame 30 can be elastically deformed is increased from D2 to D3 by causing plastic deformation in the bent portions 36a, 36b.

As described above, although specific examples of the technology disclosed in the present specification have been described in detail, they are mere examples and do not limit the claims. The technology described in the claims includes various modifications and changes of the specific examples described above. The technical elements described in the present specification or the drawings exert technical utility alone or in various combinations, and are not limited to the combinations of descriptions in the claims at the time of filing. In addition, the technology exemplified in the present specification or the drawings can achieve a plurality of objects at the same time, and has technical utility by achieving one of the objects.

What is claimed is:

1. A power conversion device comprising:
   a plurality of semiconductor modules, each having a semiconductor element;
   a plurality of coolers, each having a refrigerant flow path inside; and
   a frame configured to pressurize and hold a stacked body in which the semiconductor modules and the coolers are alternately stacked, in a stacking direction of the stacked body, the stacked body having first and second oppositely-facing ends in the stacking direction, wherein
   the frame surrounds an outer circumference of the stacked body in a plan view in which the stacked body is viewed from above in a direction perpendicular to the stacking direction of the stacked body, and the frame includes a first frame and a second frame that sandwich the stacked body between the first frame and the second frame,
   the first frame is a plate material bent to surround the stacked body from three directions,
   the first frame includes a pair of side walls extending in the stacking direction of the stacked body, and an abutting wall extending between the side walls and abutting the first end of the stacked body,
   the second frame is adjacent to and abuts the second end of the stacked body,
   the abutting wall is curved outward away from an interior of the frame in the plan view, and
   each of the side walls is curved inward toward the interior of the frame in the plan view.

2. The power conversion device according to claim 1, wherein a bending stiffness of the second frame in the stacking direction of the stacked body is higher than a bending stiffness of the abutting wall of the first frame in the stacking direction of the stacked body.

3. The power conversion device according to claim 2, wherein:
   the second frame is a plate material having at least one bent portion; and
   a bent line of the bent portion extends between the side walls in a direction perpendicular to the stacking direction.

4. The power conversion device according to claim 1, wherein a bending stiffness of the second frame in the stacking direction of the stacked body is higher than a bending stiffness in a plate thickness direction of the side walls of the first frame.

5. The power conversion device according to claim 1, wherein the first frame is made of metal.

6. The power conversion device according to claim 1, wherein:
   the abutting wall is curved outward away from the interior of the frame in the plan view so as to be convex, and each of the side walls is curved inward toward the interior of the frame in the plan view so as to be concave.

\* \* \* \* \*